United States Patent

Ohtani

[11] Patent Number: 5,225,396
[45] Date of Patent: Jul. 6, 1993

[54] METHOD FOR FORMING AN OXIDE SUPERCONDUCTING FILM

[75] Inventor: Hisashi Ohtani, Kanagawa, Japan

[73] Assignee: Semiconductor Energy Laboratory Co., Ltd., Atsugi, Japan

[21] Appl. No.: 735,348

[22] Filed: Jul. 24, 1991

[30] Foreign Application Priority Data

Jul. 25, 1990 [JP] Japan .................................. 2-196868

[51] Int. Cl.$^5$ .................... B05D 5/12; C23C 16/00; C23C 14/00
[52] U.S. Cl. ......................................... 505/1; 505/730; 505/731; 505/732; 505/734; 427/62; 427/126.3; 427/596; 427/561; 427/529; 427/255.3; 204/192.24
[58] Field of Search ................... 505/1, 731, 732, 730, 505/734; 427/62, 63, 53.1, 255.3, 126.3, 38, 596, 561, 529; 204/192.24

[56] References Cited

U.S. PATENT DOCUMENTS 4,950,642 8/1990 Okamoto et al. ....................... 505/1

Primary Examiner—Shrive Beck
Assistant Examiner—Roy V. King
Attorney, Agent, or Firm—Sixbey, Friedman, Leedom & Ferguson

[57] ABSTRACT

A method for forming an oxide superconducting film is disclosed. A substrate member comprising an oxygen ion conductor and a material provided thereon having oxygen permeability and good fitting of lattice constant to the oxide superconducting film is prepared, and then an oxide superconducting film is formed on the substrate member. During the formation of the superconducting film, electric current is made to flow through the substrate member, whereby oxygen is supplied to the superconducting film.

16 Claims, 3 Drawing Sheets

METHOD FOR FORMING AN OXIDE SUPERCONDUCTING FILM

BACKGROUND OF THE INVENTION

1. Field of the Invention

The present invention relates to a method for forming an oxide superconducting film.

2. Description of the Prior Art

Conventionally, a Nb-Ge metallic material, e.g. $Nb_3Ge$, has been utilized as a superconducting material. The coherent length of this material is comparatively long, therefore, it is quite easy to manufacture by using the metallic superconducting material a Josephson device, for example, in which an insulator is provided between superconducting materials. Also, it is actually possible to manufacture a device such as a transistor utilizing proximity effect. Further, since the metallic superconducting material does not have anisotropy, it is not necessary to pay attention to alignment of its axes and the like when manufacturing an electronic device using this metallic material.

However, the metallic superconducting material has a disadvantage that the critical temperature (at which resistance becomes zero) thereof is as low as 23K or less. Therefore, it has been required to manufacture an electronic device utilizing an oxide superconducting material whose critical temperature is higher than the liquid nitrogen temperature (77K), for an industrial application.

Methods for forming a superconducting oxide thin film are divided into two kinds; one is a method in which an oxidation step such as annealing with oxygen is carried out after a film formation step, and the other is a method in which an oxidation such as annealing with oxygen is carried out during film formation. With respect to the former method, a film obtained is a polycrystalline film having weak junctions or Josephson junctions formed on grain boundaries formed in the polycrystalline film. Since oxide superconducting materials essentially have short coherent length, electronic devices such as Josephson devices formed by the former method are affected by these junctions. Therefore, the former method is insufficient for manufacturing devices. On the other hand, the film obtained by the latter method is a single crystalline-like thin film.

For the above reason, the latter method has attracted interests of researchers.

Since superconductivity of an oxide superconducting material is very sensitive to an oxygen amount thereof and the oxide superconducting material exhibits superconductivity only at a fixed amount of oxygen thereof, it is necessary to finely control the oxygen amount. The oxidation of the latter method is conventionally carried out in an atmosphere comprising an oxidizing gas, for example oxygen gas, ozone gas, nitrogen oxide gas, or oxygen plasma, typically oxygen gas. In the case of the oxidation carried out in such an atmosphere, oxidation condition for realizing the fixed oxygen amount is conventionally determined through trial and error. In addition, even if thin films are formed under the same conditions by the latter method, the critical temperatures of the thin films are sometimes substantially different.

For obtaining a single crystalline-like thin film of good quality, high degree of vacuum is preferred during the film formation. The high degree of vacuum is also preferred in order to enlarge mean free path and reduce impurity concentration in the film to be formed. However, in the case that the oxidation of the latter method is carried out in an oxidizing atmosphere such as oxygen atmosphere, the degree of vacuum during the film formation cannot help being lowered. As a result, the quality of the film is badly affected.

SUMMARY OF THE INVENTION

It is an object of the present invention to provide a method for forming an oxide superconducting film of good quality.

In order to attain the above and other objects, an oxide superconducting film is formed on a substrate with oxygen supplied through the substrate thereto. In accordance with an aspect of the present invention, a substrate made of a material having oxygen ion conductivity such as stabilized zirconia, for example yttrium stabilized zircon (YSZ) or calcium stabilized zircon (CSZ), is prepared. An oxide superconducting film is formed on the substrate.

In accordance with another aspect of the present invention, instead of the above substrate, a substrate member may be utilized wherein first a substrate having oxygen ion conductivity is prepared and then a layer (e.g. strontium titanate) having oxygen permeability and good fitting of lattice constant to a superconducting material is formed on the substrate. An oxide superconducting film is formed on the layer (e.g. strontium titanate).

In accordance with a further aspect of the present invention, another substrate member may be utilized instead wherein first a substrate (e.g. strontium titanate) having oxygen permeability and good fitting of lattice constant to a superconducting material is prepared and then a film having oxygen ion conductivity is formed on a surface of the substrate. In this case, an oxide superconducting film is formed on the other surface of the substrate.

During the formation of the oxide superconducting film, the oxygen ion conductor is energized with electric current, whereby oxygen is injected into the superconducting film through the oxygen ion conductor.

To directly inject oxygen through an oxygen ion conductor such as YSZ or CSZ as described above is advantageous. First, since oxygen supplied is not in vapor phase, the degree of vacuum in a chamber is not degraded simultaneously, resulting in enlarging mean free path in the oxide superconducting film, elevating deposition rate, and reducing impurities to enter the film. Secondly, by energizing a substrate with electric current, the amount of oxygen can be severely controlled, therefore, this oxygen supplying method is suitable for a material such as an oxide superconducting material, which is sensitive to oxygen amount therein. Thirdly, oxygen can be removed from the oxide superconducting film by changing the direction in which electric current is made to flow, whereby the amount of oxygen can be further severely controlled.

The composition of the present invention will be described hereinafter in accordance with FIG. 1. A film formation source 1 is a source for supplying metals to compose an oxide superconducting material, and the metals may be deposited by any of CVD, vapor deposition method, ion cluster beam method, MBE (molecular beam epitaxy) method, and laser ablation method in the present invention. The metals and the like supplied from the film formation source 1 are deposited to be a film on a substrate 2, for example a strontium titanate substrate, provided on an yttrium stabilized zircon plate 3. During this deposition step, oxygen is supplied from air under the plate 3 to the plate 3, and electric current is made to flow through platinum electrodes 4 and 5, that is, oxygen ion flow is formed through the plate 3 and the substrate 2, and thereby oxygen is supplied to the film. The film is thus formed and oxidized at the same time to thereby exhibit superconductivity. Since oxygen ions are attracted at an adjacency of the platinum electrode 4, distribution of the oxygen ion concentration on the substrate becomes ununiform. However, the oxide superconducting material itself functions as an oxygen ion conductor, so that the oxygen ions are actually diffused in the entire oxide superconducting film.

In the case of forming an oxide superconducting film on any of the above-mentioned substrate members, a material, whose reactivity with the oxide superconducting film is sufficiently low; whose lattice constant is fit for that of the oxide superconducting film; and which has oxygen ions permeability, is suitable for the material on which the oxide superconducting film is to be formed. For example, strontium titanate is suitable for the material. Oxygen ion conductor such as a stabilized zirconia has electronic conduction and ionic conduction around room temperature. However, transport number of oxygen ion conductor such as a stabilized zirconia is about 1 at a temperature of 700° C. or higher. Therefore, when carrying out formation of the oxide superconducting film at an oxygen ion conductor temperature of 700° C. or higher, amount of oxygen supplied to the superconducting film through the oxygen ion conductor can be severely controlled by controlling electric current flowing through the oxygen ion conductor.

BRIEF DESCRIPTION OF THE DRAWINGS

The present invention will now be described with reference to the accompanying drawings wherein.

DETAILED DESCRIPTION OF THE PREFERRED EMBODIMENTS

In the following embodiments, yttrium-based superconducting material ($Y_1Ba_2Cu_3O_{7-y}$) is utilized as a superconducting material.

EMBODIMENT 1

Figure 1:
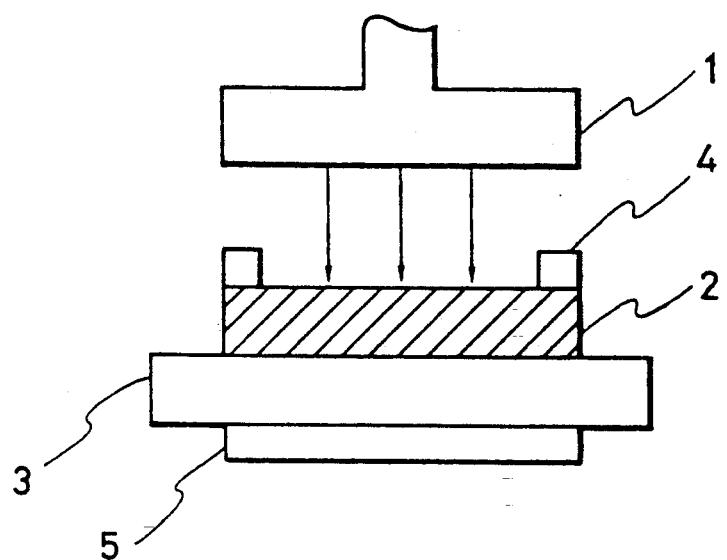
FIG. 1 is an explanatory view showing formation of a film in accordance with the present invention.
Figure 2:
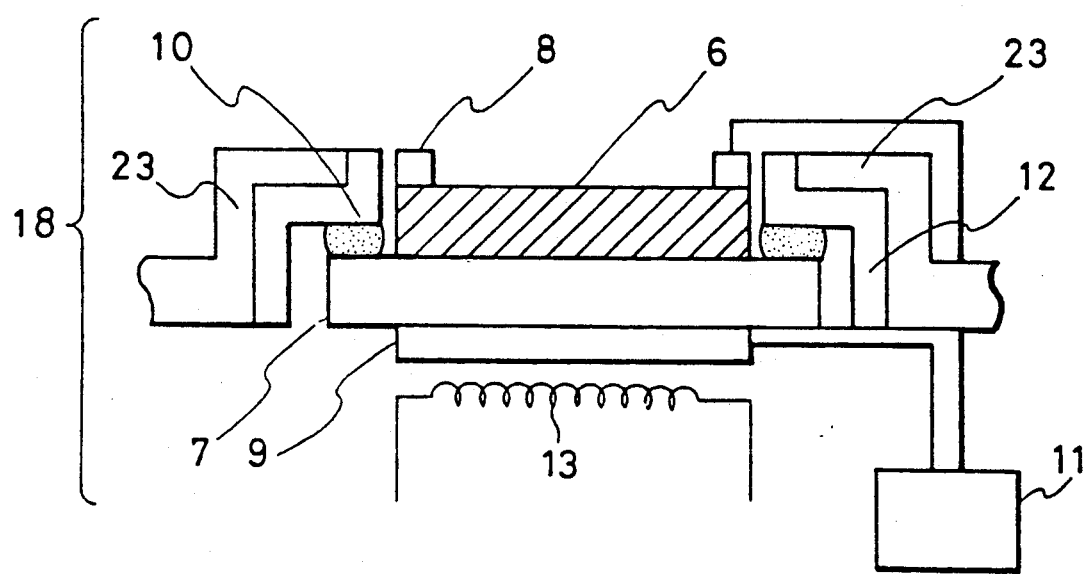
FIG. 2 is a schematic cross sectional view showing a substrate disposed in a film formation apparatus in the present invention.
Figure 3:
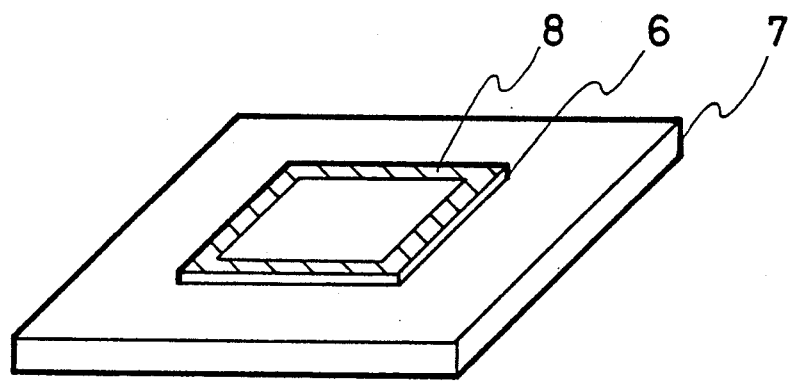
FIG. 3 is a schematic view showing an upper electrode formed on a substrate.

In this embodiment, MOCVD (metal organics chemical vapor deposition) method is utilized. Structure 18 of the periphery of a substrate 6 is shown in FIG. 2. An yttrium stabilized zircon plate 7 of about 20 mm square whose surface was a [100] plane was prepared. On the plate 7, a strontium titanate layer whose surface was a [100] plane was formed to be about 1 μm thick by sputtering. This structure was utilized as a substrate 6. On this substrate 6, platinum paste was applied at about 1 mm width on the substrate 6 and then heated by a heater 13 to vaporize a solvent contained therein, whereby an upper platinum electrode 8 was obtained. The upper platinum electrode is also shown by numeral 8 in FIG. 3. Further, a platinum mesh was provided under the yttrium stabilized zircon plate 7 as a lower electrode 9. These upper and lower platinum electrodes were connected to a constant current generating apparatus 11 by means of platinum lead wires. The substrate was attached to a chamber by means of metal O rings 10. An insulating layer 12 is provided on the connecting portion 23 of the chamber with the substrate.

Figure 4:
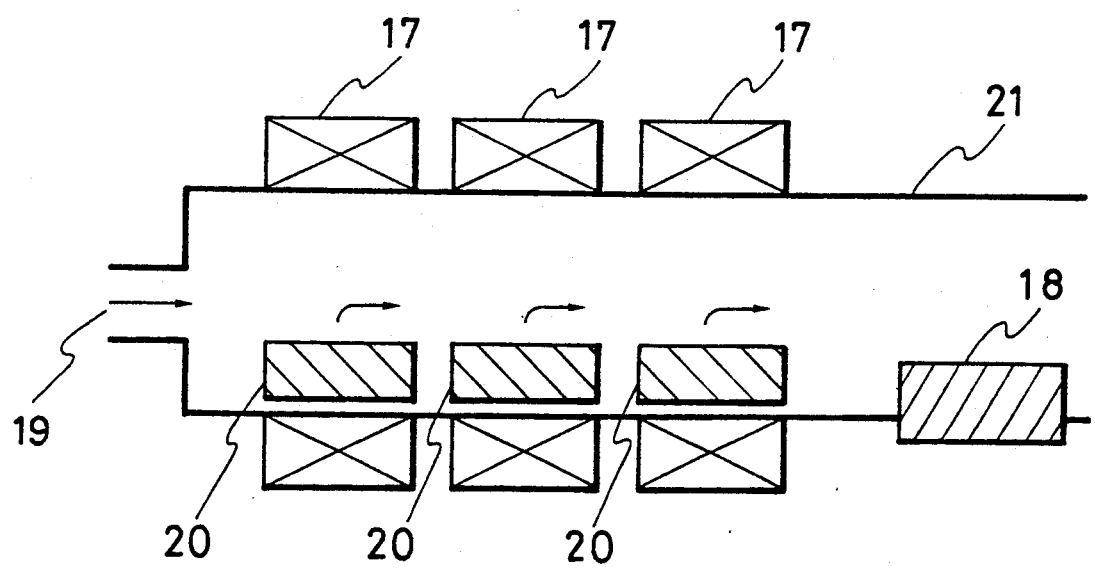
FIG. 4 is a schematic view of a film formation apparatus by MOCVD.

A film formation apparatus by MOCVD utilized in this embodiment is schematically shown in FIG. 4. β-diketone metallic complex was utilized as MO (metal organics) material. The MO material was provided in quartz cells 20 in a chamber 21 evacuated to 5–10 Torr and then heated to be vaporized by heaters 17. The vaporization temperature was controlled within the range of 120° to 240° C. depending on the material. Then, helium was introduced into the chamber 21 as a carrier gas 19. The vaporized MO material was carried toward a substrate 6 provided in the structure 18 by the carrier gas 19 and deposited on the substrate 6 to form a film. During this film formation, electric current was made to flow through platinum electrodes in accordance with the deposition rate of the MO material, whereby oxygen was injected into the film. At this moment, the electric current flowed at 1–10 mA, e.g. 5 mA.

The obtained film had a thickness of about 7000 Å and exhibited superconductivity. Critical temperature thereof was about 92 K., and critical current density Jc thereof in no magnetic fields was about $3 \times 10^6$ A/cm$^2$, which value is considerably preferable. When the obtained film was measured by XRD, only a peak originated from a C-axis alignment was observed. Accordingly, it was recognized C-axes of the film obtained were aligned. When carrying out the same experiment repeatedly in the same apparatus, reproducibility was so high.

EMBODIMENT 2

Figure 5:
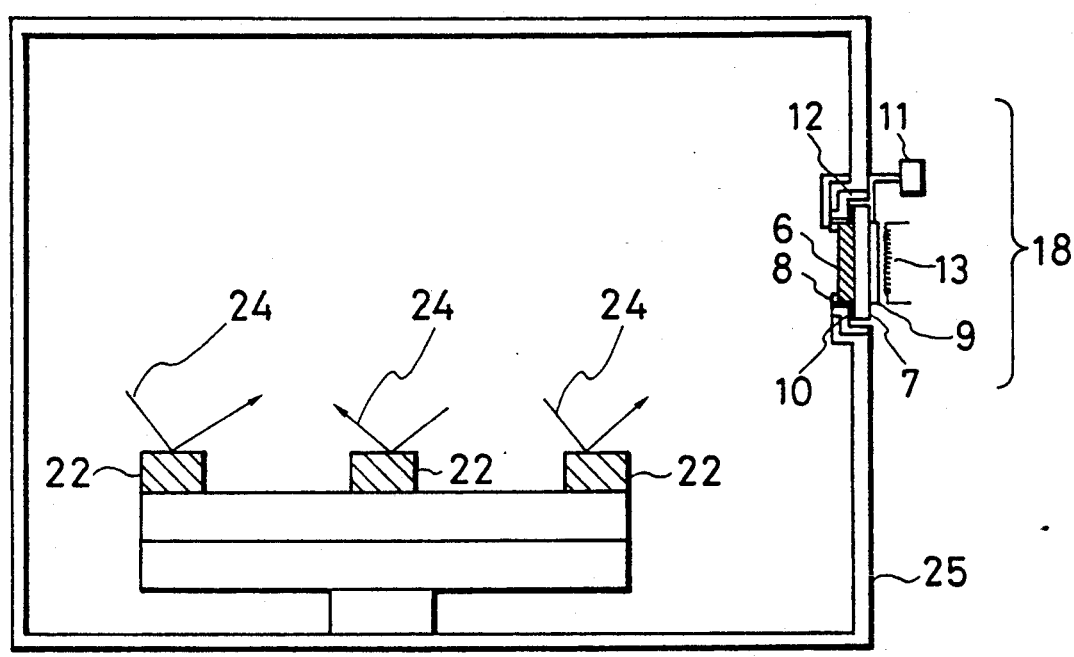
FIG. 5 is a schematic view of a film formation apparatus by sputtering.

In this embodiment, sputtering method is utilized. An apparatus utilized in this embodiment is illustrated in FIG. 5. Structure 18 of the periphery of a substrate 6 in this embodiment is same as that shown in FIG. 2. Three kinds of metals (yttrium, barium, and copper) were utilized as targets 22. Thin film formation was carried out in a chamber 25 evacuated by a rotary pump and a turbo molecular pump. Pressure in the chamber was maintained at 0.1–0.01 Torr during film formation. The targets were applied with alternating voltages at radio frequencies of 13.56 MHz and sputtered by argon ions 24 by RF sputtering method. In accordance with the film formation rate, electric current was made to flow at 1–10 mA, e.g. 5 mA, whereby oxygen was supplied to the thin film. The thin film obtained had a film thickness of about 5000 Å. The critical temperature thereof was about 88 K. and the critical current density thereof at no magnetic fields was about $10^5$ A/cm$^2$.

When the film was measured by XRD, it was recognized C-axes of the thin film were aligned. When carrying out the same experiment repeatedly in the same apparatus, reproducibility was so high.

EMBODIMENT 3

Figure 6:
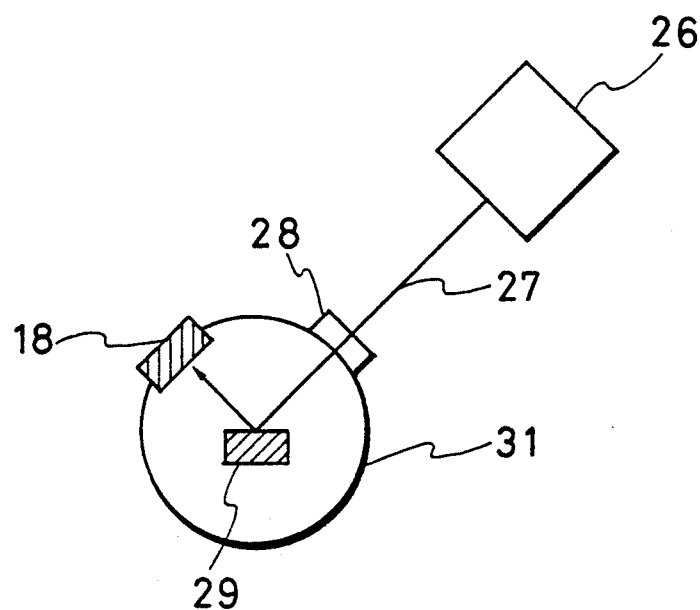
FIG. 6 is a schematic view of a film formation apparatus by laser ablation method.

In this embodiment, laser ablation method is utilized. An apparatus utilized in this embodiment is illustrated in FIG. 6. Structure 18 of the periphery of a substrate 6 in this embodiment is the same as in FIG. 2. An yttrium-based superconducting material formed by powder method was pelletized and utilized as a target 29. It was confirmed in advance that the target exhibited superconductivity. Excimer laser was used as laser 26, and laser light 27 was emitted to the target 29 through a quartz window 28. Film formation was carried out in the chamber 31 evacuated to about $10^{-6}$ Torr by a rotary pump and an oil diffusion pump.

First, thin film formation was carried out with no supply of oxygen. However, the thin film obtained did not exhibit superconductivity. When the above thin film was examined, it was found the thin film was short of oxygen.

Then, amount of oxygen which the above thin film was short of was calculated, and this time a sufficient amount of oxygen was supplied in accordance with film formation rate during film formation. The thin film obtained this time exhibited superconductivity. The thickness thereof was about 5000 Å, and C-axes therein were aligned.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. In the above embodiments is described the formation of a superconducting film comprising $Y_1Ba_2Cu_3O_{7-x}$, however, other superconducting films can be also formed by the method of the present invention. For example, such superconducting films comprise $(La_{1-x}M_x)_2CuO_4$ (M=Ba, Sr, Ca, K), $La_2CuO_4$, $(Ln_{1-x}M)_2CuO_4$ (Ln=Nd, Pr, Sm, M=Ce, Th), $(Nd_{1-x-y}Sr_xCe_y)_2CuO_4$, $(Ln_{1-x}M_x)_2(Ln_{1-y}M'_y)_2Cu_3O_z$ (Ln=Nd, Sm, Eu, M=Ce, M'=Ba), $LnBa_2Cu_3O_z$ (Ln=rare earth elements), $LnBa_2Cu_4O_8$ (Ln=Y and rare earth elements), $Ln_2Ba_4Cu_7O_{15}$ (Ln=Y and rare earth elements), $Bi_2Sr_2Ca_{n-1}Cu_nO_{2n+4}$ (n=1 to 5), $Tl_2Ba_2Ca_{n-1}Cu_nO_{2n+4}$ (n=1 to 4), $TlBa_2Ca_{n-1}Cu_nO_{2n+3}$ (n=1 to 5), $TlSr_2Ca_{n-1}Cu_nO_{2n+3}$ (n=2, 3), $Pb_2Sr_2Ln_{1-x-y}Ca_xSr_yCu_3O_8$ (Ln=Y and rare earth elements), or $Tl_{1-x}Pb_xSr_2Ln_{1-y}Ca_yCu_2O_z$ wherein $0 \leq x \leq 1$, $0 \leq y \leq 1$ and rare earth elements are La, Ce, Pr, Nd, Pm, Sm, Eu, Gd, Tb, Dy, Ho, Er, Tm, Yb, Lu, Sc, and Y.

What is claimed is:

1. A method for forming an oxide superconducting film comprising:
   depositing an oxide superconducting precursor film on a substrate, where said substrate has an oxygen ion conductivity; and
   introducing oxygen into the depositing film through said substrate during the deposition of said film in order to effect oxidation of the depositing film to thereby form said oxide superconducting film;
   wherein the introduction of said oxygen is carried out with current flow through said substrate.

2. The method of claim 1 wherein said substrate comprises a stabilized zirconia.

3. The method of claim 1 wherein said substrate comprises a material selected from the group consisting of yttrium stabilized zircon and calcium stabilized zircon.

4. The method of claim 1 wherein the deposition is carried out by a method selected from the group consisting of CVD method, sputtering method, vapor deposition method, ion cluster beam method, molecular beam epitaxy method, and laser ablation method.

5. A method for forming an oxide superconducting film comprising:
   forming on a substrate having oxygen ion conductivity an interlayer through which oxygen permeates;
   depositing an oxide superconducting precursor film on said interlayer; and
   introducing oxygen into the depositing film through said substrate and said interlayer during the deposition of said film in order to effect oxidation of the depositing film to thereby form said oxide superconducting film,
   said interlayer serving to enhance alignment of said superconducting film with an underlying layer provided under said superconducting film,
   wherein the introduction of said oxygen is carried out with current flow effected through said substrate.

6. The method of claim 5 wherein said substrate comprises a stabilized zirconia.

7. The method of claim 5 wherein said substrate comprises a material selected from the group consisting of yttrium stabilized zircon and calcium stabilized zircon.

8. The method of claim 5 wherein the deposition is carried out by a method selected from the group consisting of CVD method, sputtering method, vapor deposition method, ion cluster beam method, molecular beam epitaxy method, and laser ablation method.

9. A method for forming an oxide superconducting film comprising:
   forming a layer having oxygen ion conductivity on a surface of a substrate through which oxygen permeates;
   depositing an oxide superconducting precursor film on a surface of said substrate opposite to the surface on which said layer is formed; and
   introducing oxygen into the depositing film through said layer and said substrate during the deposition of said film in order to effect oxidation of the deposition film to thereby form said oxide superconducting film,
   said substrate serving to enhance alignment of said superconducting film with an underlying layer provided under said superconducting film,
   wherein the introduction of said oxygen is carried out with current flow effected through said substrate.

10. The method of claim 9 wherein said layer comprises a stabilized zirconia.

11. The method of claim 9 wherein said layer comprises a material selected from the group consisting of yttrium stabilized zircon and calcium stabilized zircon.

12. The method of claim 9 wherein the deposition is carried out by a method selected from the group consisting of CVD method, sputtering method, vapor deposition method, ion cluster beam method, molecular beam epitaxy method, and laser ablation method.

13. A method for forming an oxide superconducting film comprising:
   depositing an oxide superconducting precursor film on a substrate, where said substrate has an oxygen ion conductivity; and
   controlling oxygen content of said film during the deposition, said controlling step comprising introduction of said oxygen into the depositing film through said substrate and removal of said oxygen from said film through said substrate to thereby form said oxide superconducting film,
wherein the introduction and removal is carried out with current flow through said substrate.

14. The method of claim 13 wherein said substrate comprises a stabilized zirconia.

15. The method of claim 13 wherein said substrate comprises a material selected from the group consisting of yttrium stabilized zircon and calcium stabilized zircon.

16. The method of claim 13 wherein the deposition is carried out by a method selected from the group consisting of CVD method, sputtering method, vapor deposition method, ion cluster beam method, molecular beam epitaxy method, and laser ablation method.

* * * * *